United States Patent
Oberlaender

(10) Patent No.: US 8,010,847 B2
(45) Date of Patent: Aug. 30, 2011

(54) MEMORY REPAIR

(75) Inventor: Klaus Oberlaender, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 290 days.

(21) Appl. No.: 12/241,872

(22) Filed: Sep. 30, 2008

(65) Prior Publication Data

US 2010/0083037 A1 Apr. 1, 2010

(51) Int. Cl.
*G06F 11/00* (2006.01)
(52) U.S. Cl. .......................... 714/42; 714/5.11
(58) Field of Classification Search .................... 714/42
See application file for complete search history.

(56) References Cited

U.S. PATENT DOCUMENTS

| | | | | |
|---|---|---|---|---|
| 6,145,055 A * | 11/2000 | Fujimoto | | 711/128 |
| 6,324,623 B1 * | 11/2001 | Carey | | 711/148 |
| 6,907,554 B2 * | 6/2005 | Adams et al. | | 714/718 |
| 6,910,161 B2 * | 6/2005 | Kuhn et al. | | 714/710 |
| 7,003,646 B2 * | 2/2006 | Roy et al. | | 711/171 |
| 7,188,274 B2 * | 3/2007 | Nadeau-Dostie et al. | | 714/6 |
| 7,219,276 B2 * | 5/2007 | Mantri | | 714/723 |
| 7,284,166 B2 * | 10/2007 | Zappa et al. | | 714/710 |
| 7,607,038 B2 * | 10/2009 | Barlow et al. | | 714/7 |
| 7,627,792 B2 * | 12/2009 | Di Ronza et al. | | 714/710 |
| 7,630,258 B2 * | 12/2009 | Fong | | 365/200 |
| 7,778,070 B2 * | 8/2010 | Nirschl et al. | | 365/163 |
| 2004/0163015 A1 * | 8/2004 | Nadeau-Dostie et al. | | 714/42 |
| 2004/0225939 A1 * | 11/2004 | Adams et al. | | 714/733 |
| 2004/0257891 A1 * | 12/2004 | Kim et al. | | 365/200 |
| 2005/0066226 A1 * | 3/2005 | Adams et al. | | 714/7 |
| 2005/0076273 A1 * | 4/2005 | Mantri | | 714/718 |
| 2005/0149839 A1 * | 7/2005 | Dent | | 714/800 |
| 2005/0188249 A1 * | 8/2005 | Hart et al. | | 714/5 |
| 2005/0289287 A1 * | 12/2005 | Shin et al. | | 711/1 |
| 2006/0077734 A1 * | 4/2006 | Fong | | 365/200 |
| 2006/0248392 A1 * | 11/2006 | Barlow et al. | | 714/30 |
| 2008/0091988 A1 * | 4/2008 | Yoel et al. | | 714/711 |
| 2008/0301597 A1 * | 12/2008 | Chen et al. | | 716/5 |
| 2009/0003046 A1 * | 1/2009 | Nirschl et al. | | 365/163 |
| 2009/0055706 A1 * | 2/2009 | Lin | | 714/758 |
| 2010/0107010 A1 * | 4/2010 | Warnes et al. | | 714/36 |

FOREIGN PATENT DOCUMENTS

DE    10 2004 012 279 B3    6/2005

* cited by examiner

*Primary Examiner* — Scott T Baderman
*Assistant Examiner* — Kamini Patel
(74) *Attorney, Agent, or Firm* — Dickstein Shapiro LLP

(57) ABSTRACT

A memory chip having a memory with a plurality of non-redundant memory lines and a plurality of redundant memory lines, and a controller configured to allocate dynamically a redundant memory line to a failed memory line during runtime.

8 Claims, 9 Drawing Sheets

MEMORY REPAIR

BACKGROUND

Memory reliability problems are a result of decreasing device structure sizes along with increasing numbers of transistors due to increasing memory size. Memories have been protected against hard fails using Error Correction Code (ECC) Single Error Correction Double Error Detection (SECDED) encoding. ECC SECDED is not an ideal approach for some applications due to its drawback of requiring more transistors and hence a massive overhead in terms of area and power. This is especially a problem for systems where it is necessary to conduct small write accesses that can not be mapped into read-modify-write accesses due to performance restrictions.

As illustrated in Table 1 below, in ECC SECDED encoding the number of ECC bits is logarithmically proportional to the number of data bits, and thus smaller access widths cause more overall overhead than wide access widths. If the write access width is only 16 bits, then there are 6 extra ECC bits per 16 data bits. These narrow writes could not be mapped into wider read-modify-write accesses due to performance restrictions.

TABLE 1

Ratio of Error Correcting Code vs. "Normal" Information Using SECDED

| n | Width of normal data word $2^n$ | Width of required SECDED code (n + 2) | Ratio of error correcting code/ normal information |
|---|---|---|---|
| 3 | 8 | 5 | 62.50% |
| 4 | 16 | 6 | 37.50% |
| 5 | 32 | 7 | 21.88% |
| 6 | 64 | 8 | 12.50% |
| 7 | 128 | 9 | 7.03% |

DETAILED DESCRIPTION

Figure 1A:
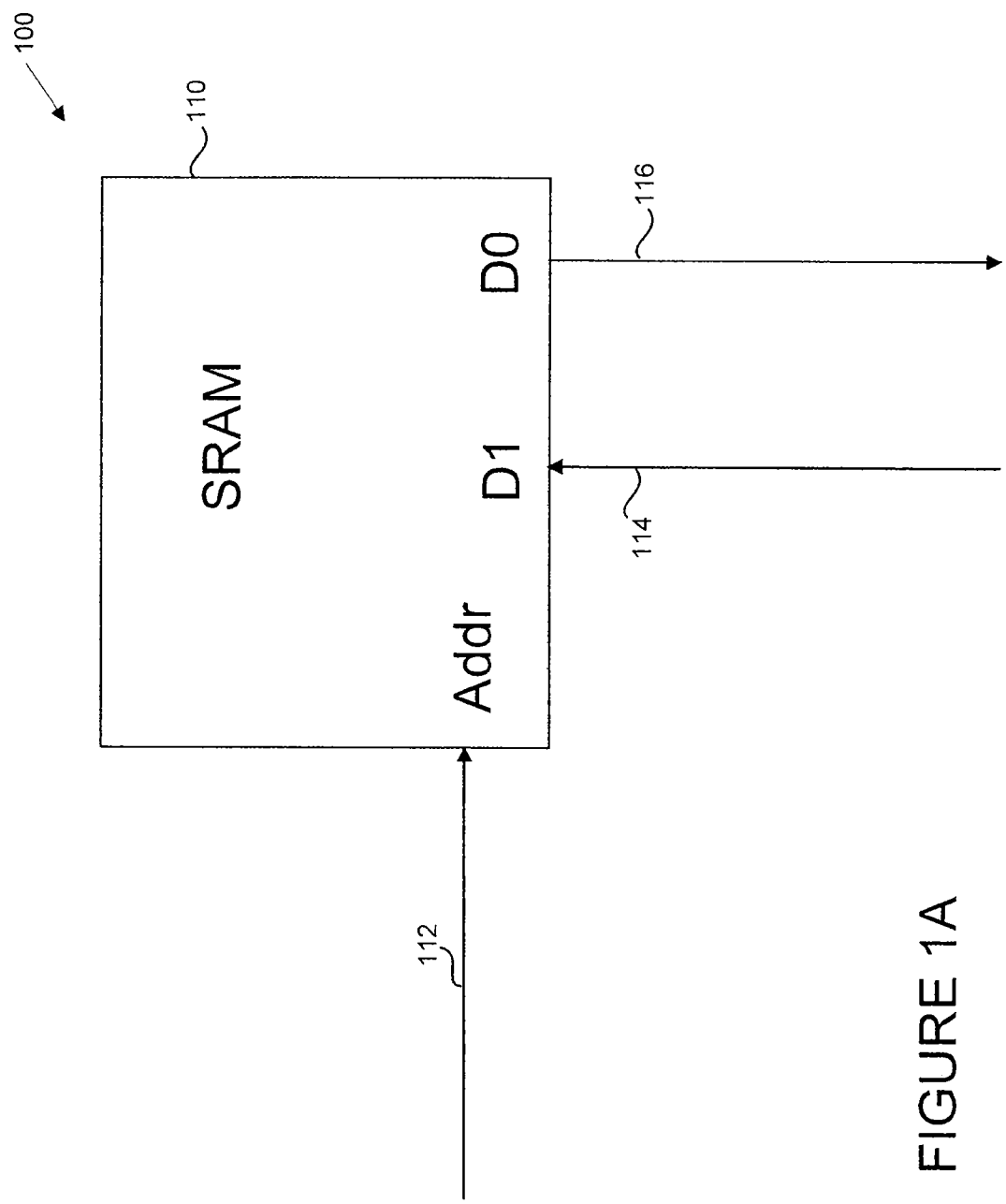
FIGS. 1A through 1E are functional diagrams of portions of a memory chip having SMART Repair according to an exemplary embodiment.

"SMART Repair" according to embodiments described below improve long-term reliability in a memory, such as an SRAM, by protecting the memory against hard fails during its lifetime. Additional redundant memory lines are used to repair faulty memory lines by copying faulty memory lines into redundant lines dynamically during runtime.

It should be understood that throughout the description a "memory line" is not to be interpreted to be a wordline of a memory, but is instead a plurality of logical memory words.

"SMART" is an acronym standing for SRAM Memory Automatic Repair Toolbox. SMART Repair approaches the memory reliability problem in a manner similar to either a soft failure detected during runtime or similar to a manufacturing fail detected during test and repaired during boot time. Approaching SMART Repair in this manner has the advantage of reusing almost the same hardware and software overhead that previously existed for the other two failure mechanisms, specific examples of which include parity soft error detection, dedicated hardware MBIST+ to detect and repair manufacturing errors, and a word redundancy block using flip-flop lines. Some SRAM designs may already have a surrounding redundancy wrapper which contains logic to replace broken lines with redundant flip-flop lines.

In addition to the previously existent redundant lines for repairing manufacturing problems, in the exemplary embodiment of the present application the number of redundant lines per memory is increased for repairing lifetime reliability problems. The number of redundant lines added to the SRAM must be sufficient so that a repair will result in a good defective parts per million (dppm) rate.

An important aspect with respect to SMART Repair is how many additional redundant lines to provide. In making this decision the designer should consider the problems a failure can cause. A single failure can impact multiple cells, such as two or four cells.

Considering that multiple cell reliability problems are unlikely even on one die, left alone in one single memory array it is safe to assume that additional lines, for example four, are necessary to fix one problem in one memory array. A brute force method would therefore be to add additional lines to each redundancy wrapper in addition to the lines previously in existence for factory repair purposes.

Additionally, the designer should consider that in reality only a small percentage of memories use all of its redundant lines for factory repair. The majority of SRAMs have no manufacturing failures and hence do not use any of these redundant lines. Redundant lines can therefore be shared for multiple purposes. The achievable defective parts per million (dppm) rate suffers as memories that use, for example, one redundant line for factory repair will not have all lines available for reliability repair. However, as discussed above, if, for example, four redundant lines are provided and one is used for repair during manufacture, all failures that affect only two neighboring cells could be repaired by the remaining three lines. For the dies with no manufacturing problems, failures that affect four neighboring cells can be repaired. Hence only those memories that have the rare failure affecting four neighboring cells suffer a decrease in the defective parts per million (dppm) rate. This is a reasonable compromise considering the area savings and the fact that the yield actually increases due to the additional redundant lines.

The number of additional redundant lines added to the SRAM is not limited to a particular number. Any number of redundant lines suitable may be used. Also, it is possible to add an odd number of additional redundant lines, but usually the number of added lines is even due to the fact that a faulty via rarely affects a single memory cell.

I. Memory Chip

FIGS. 1A through 1E are functional diagrams of portions of a memory chip 100 having SMART Repair according to an exemplary embodiment.

FIG. 1A shows an SRAM 110 having a plurality of address and data lines. For the sake of simplicity, only a single address line Addr 112 and two data lines D1, D0 114, 116 are shown. However, it is understood that additional address and data lines are included but not shown.

Figure 1B:
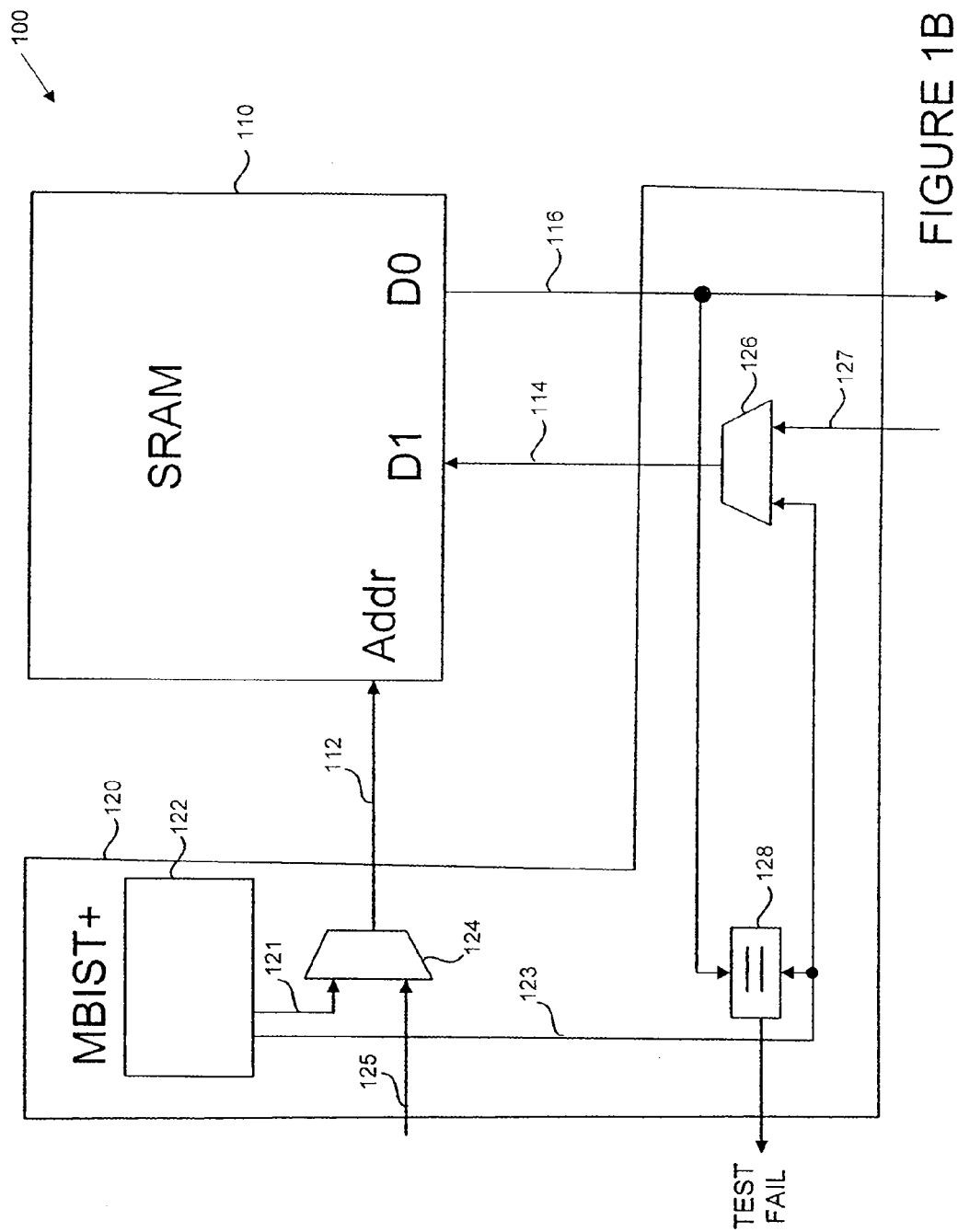

FIG. 1B shows a Memory Built-In Self Test+ (MBIST+) engine 120 portion of the memory chip 100. BIST is a technique of designing additional hardware and software features into an integrated circuit to allow the integrated circuit to perform self-testing, that is, testing of its own operation (functionally, parametrically, or both) using its own circuits, thereby reducing dependence on an external automated test equipment. MBIST, as its name implies, is used specifically for testing memories. It typically consists of test circuits that write, read, and compare test patterns designed to expose defects in the SRAM 110. There are a variety of industry-standard MBIST algorithms, such as the March algorithm, the checkerboard algorithm, and the varied pattern background algorithm. The "+" portion of "MBIST+" indicates that the MBIST engine additionally incorporates redundant line handling.

The MBIST+ engine 120 includes a finite state machine 122, a first multiplexer 124, a second multiplexer 126, and a comparator 128. The finite state machine 122 increments data and addresses under test. The SRAM data is written and then read back. Since the data is written, the expected result is known. Thus, failures are detected by comparing written data with the data read from the same address.

More specifically, the finite state machine 122 writes a data value under test to the corresponding memory line in SRAM 110. The address of the data value is transmitted to SRAM 110 via first multiplexer 124 over line 121 and address line Addr 112, and the data value corresponding to this address is written to the SRAM 110 via second multiplexer 126 over line 123 and data line D1 114. Subsequently this data value is read back from the SRAM 110 over the data line D1 114 (though in the figure data line D0 116 is shown connected to comparator 128), and comparator 128 compares the read data value with the written or known data value. If the comparator 128 determines that the values are the same, the memory line is determined to be not faulty. Otherwise, the memory line is determined to be faulty (i.e., test fail), and the faulty memory line is copied into the redundancy block, as described in detail below. Lines 125 and 127 of multiplexers 124 and 126, respectively, are used to read and write addresses and data to/from SRAM 110 during normal runtime.

Further details of MBIST+ engine 120 are known, and thus will not be described in any further detail so as not to unnecessarily obscure the description.

Figure 1C:
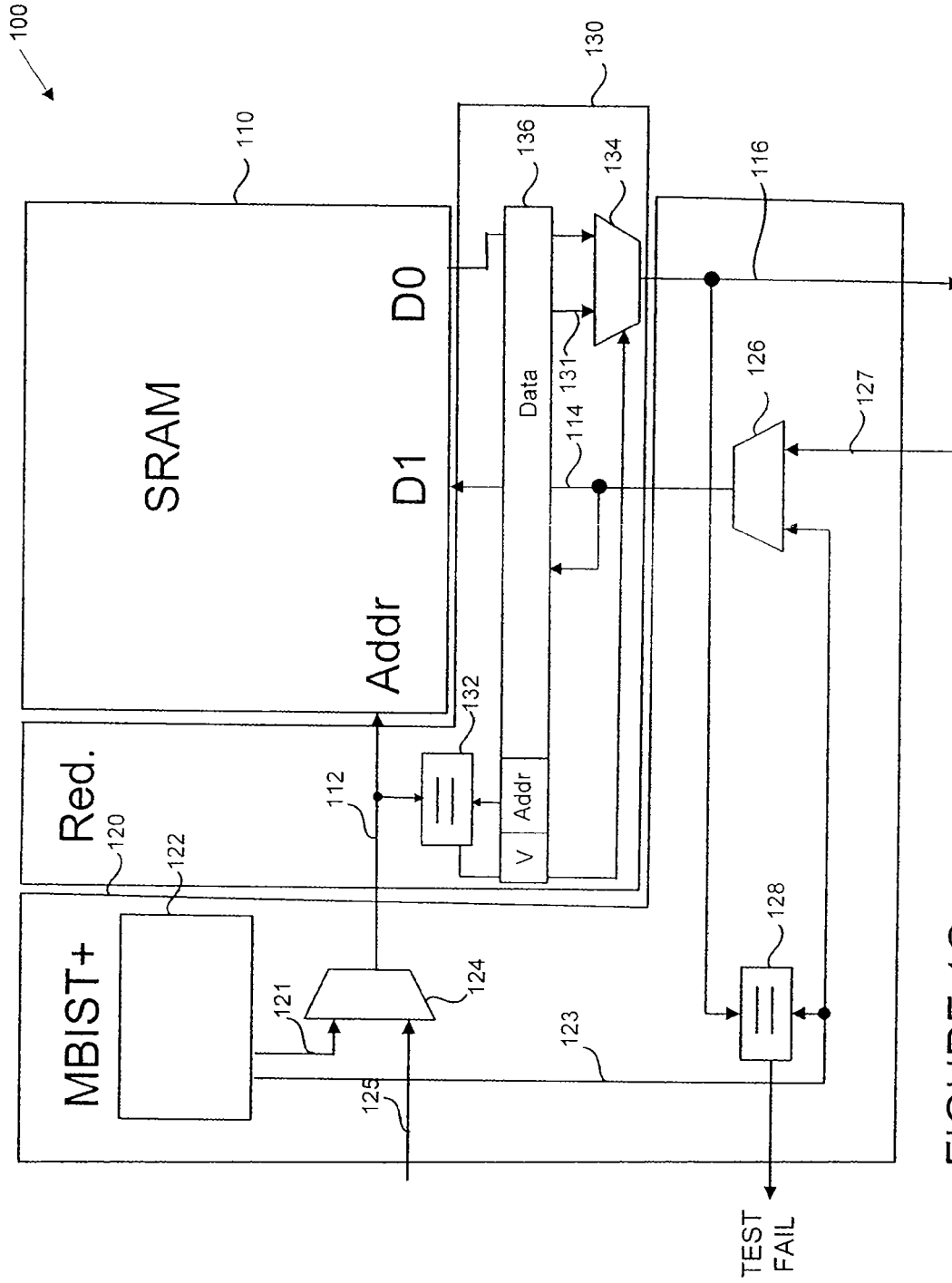

FIG. 1C additionally shows the SRAM redundancy wrapper 130 which contains logic to replace faulty memory lines with the content of redundant flip-flop lines. These lines can be programmed by the MBIST+ engine at test time automatically, and the address information of the broken lines can then be read (or written) from the system. If the system contains non-volatile memories (i.e., flash), the fail information is read from the redundancy block after the MBIST+ test and is then stored into the non-volatile memory. At boot time, this information is first read from the flash and written into the redundancy block to set it up accordingly and to make sure that any access to a broken line is detected and served by the additional flip-flop line instead. The redundancy block acts like a mini cache in front of each memory, replacing complete memory words by digital logic.

More specifically, the redundancy wrapper has a comparator 132, a multiplexer 134, and a data line 136. Each time a memory line is to be accessed for either a read or write operation, comparator 132 compares the value of the address to be accessed with that of a redundant data line 136. If comparator 132 determines that the data values are not the same, then the data at the actual SRAM address to be accessed is considered to be valid, and the read/write operation will be performed at the actual address. On the other hand, if comparator 132 determines the addresses to be the same, and if a corresponding valid bit V is set, meaning a fail was detected previously at the address, then it is determined that the data value at the actual SRAM address is faulty and replaced by a redundant data line 136. For a read operation, multiplexer 134 is used to read out data via line 131.

The redundancy wrapper 130 will not be described in any further detail so as not to unnecessarily obscure the description.

Figure 1D:
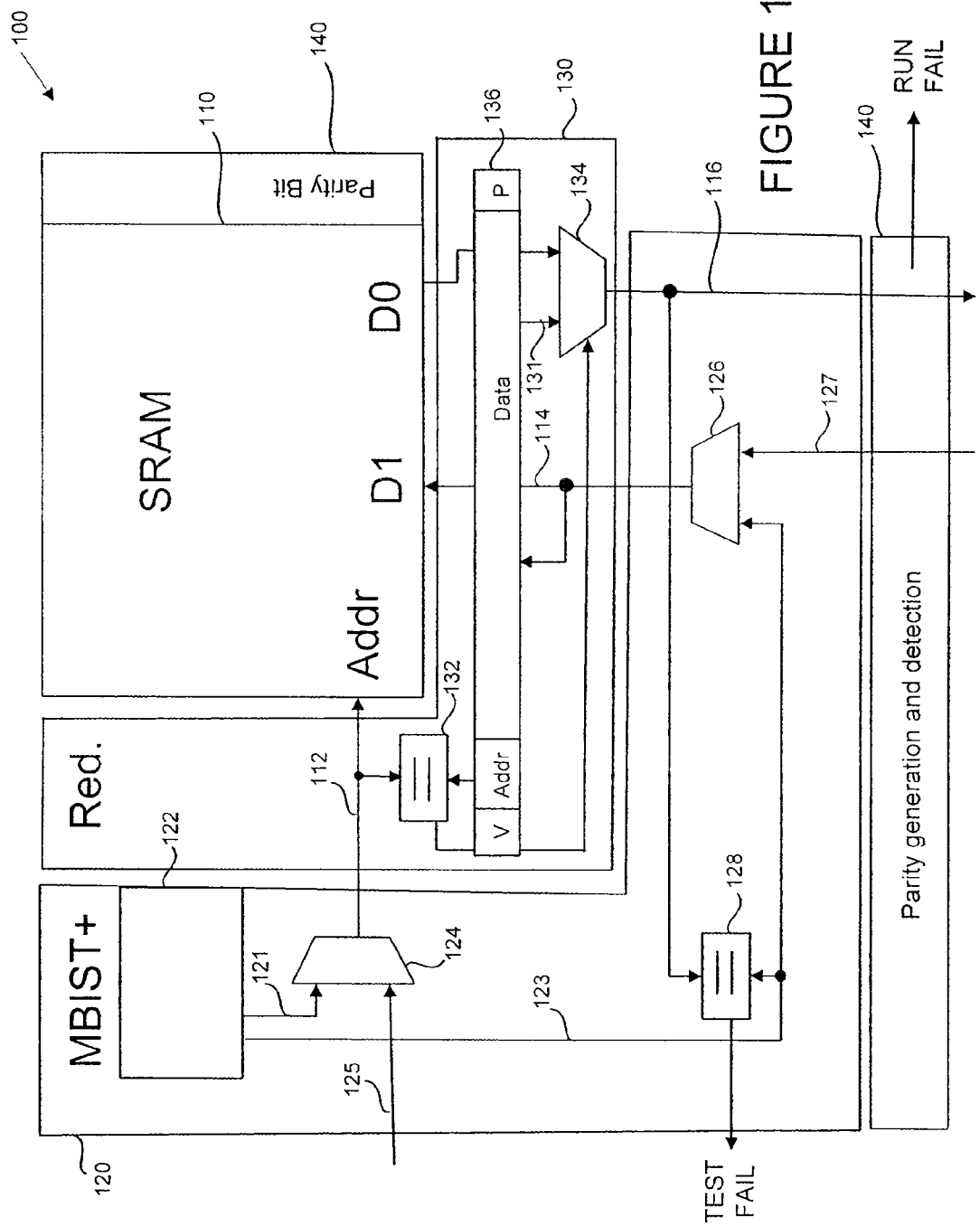

FIG. 1D additionally shows parity error generation and detection logic 140 of the memory chip 100.

Parity error generation and detection refers to the use of a parity bit to determine whether data stored in a memory line is correct. A parity bit is added to every data line and is set so that the line has either an odd number or an even number of set bits, depending whether odd or even parity is used. Assuming, for example, that even parity is used, when data is written to a data line of the SRAM, the parity error generation and detection logic 140 counts the number of set bits in the line. If the number of set bits is even, it sets the parity bit to 0; if the number of set bits is odd, it sets the parity bit to 1. In this way, every data line has an even number of set bits. When the data is subsequently read from the data line, the parity error generation and detection logic 140 checks the data line to ensure that the data line has an even number of set bits. If the logic 140 finds an odd number of set bits, then it is determined that there is an error in the stored data, and thus there is a runtime failure.

The architecture of the SRAM is such that a single failure, even one affecting a plurality of neighboring cells, such as two or four, at once, will still be detected by a parity that is normally capable of detecting only a single failure. The neighboring cells are not cells from the same data of one address. However, the physical layout of the SRAM is such that each address has only a single bit flipped by such a failure, and thus four addresses are affected by one failure.

The parity error generation and detection logic 140 will not be described in any further detail so as not to unnecessarily obscure the description.

Figure 1E:
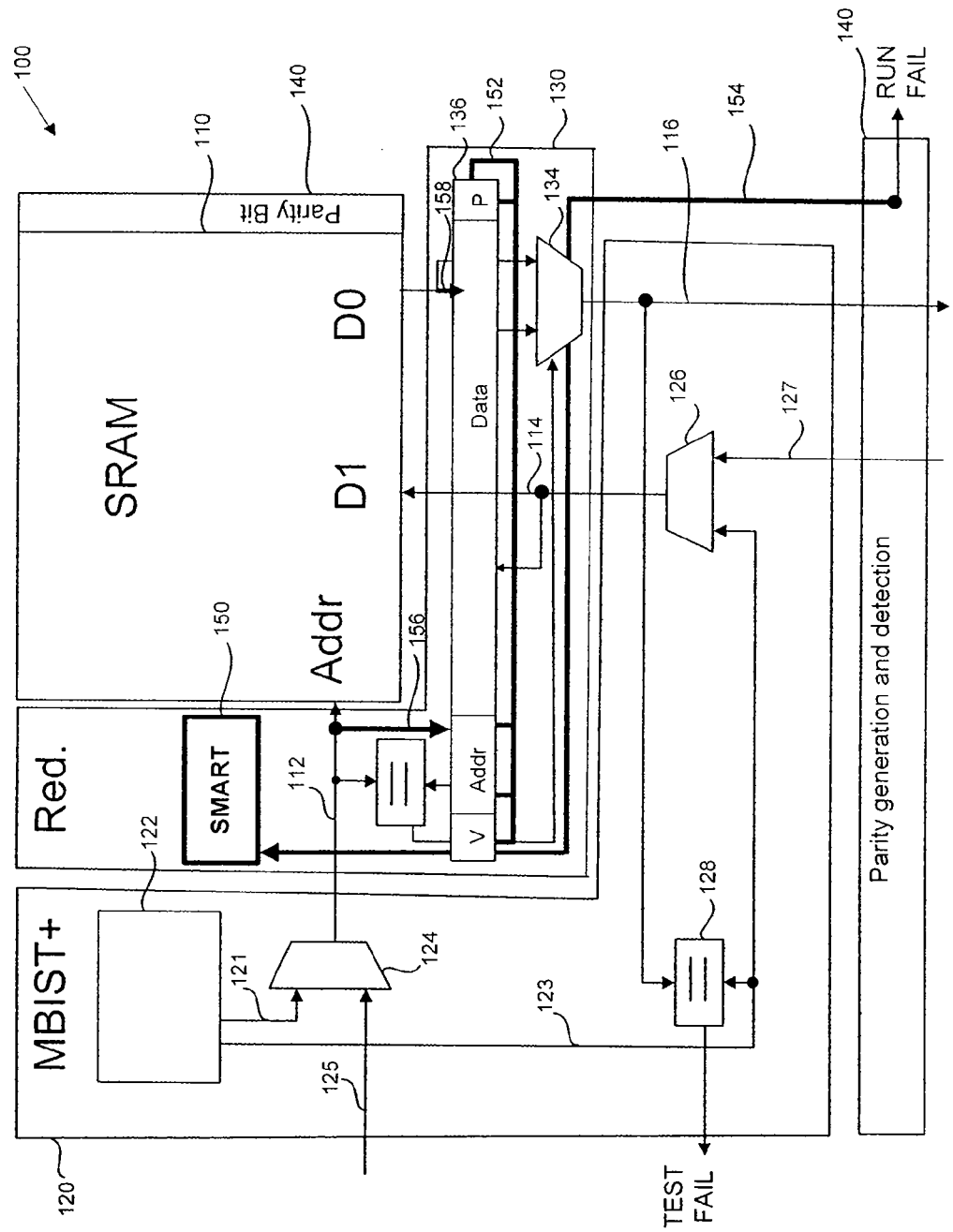

FIG. 1E additionally shows the SMART Repair logic 150 of the memory chip 100 according to an embodiment. SMART Repair logic 150, which is shown in bold, has redundant memory line 152. Upon a parity failure during runtime, the SMART Repair logic 150 effectively replaces a failed memory line with a redundant memory line on the fly.

More specifically, upon a runtime parity failure, which is signaled to the SMART Repair logic 150 over line 154, the logic 150 repairs the faulty memory line by dynamically allocating a redundant memory line 152 to the failed memory line, that is, the SMART Repair logic 150 copies the address and data from the faulty memory line into the redundant memory line 152 over lines 156 and 158, respectively, and the valid bit of the redundant memory line 152 is set. The redundant memory line 152 thus replaces the failed memory line, at least until a reboot. Thus it is the storage space with the failure that is repaired by replacing the failed memory line with the redundant memory line 152; the failed memory line 152 remains faulty and should be repaired by software.

A single redundant data line 152 is shown for the sake of simplicity. As described above, there may be any number of redundant data lines suitable for the intended purpose.

II. SMART Repair Method

SMART Repair method is not a single method, but a toolbox of up to three layers of detection and repair mechanisms. Layer 1 is used to detect faulty memory lines when powering up the SRAM at boot time. Layer 2 is used to detect faulty memory lines and dynamically allocate redundant memory lines during runtime. Layer 3 is an optional layer that extends layers 1 and 2 using software to track and store failure records generated in layers 1 and 2 in non-volatile memory (e.g., flash memory).

A. Layer 1

Figure 2:
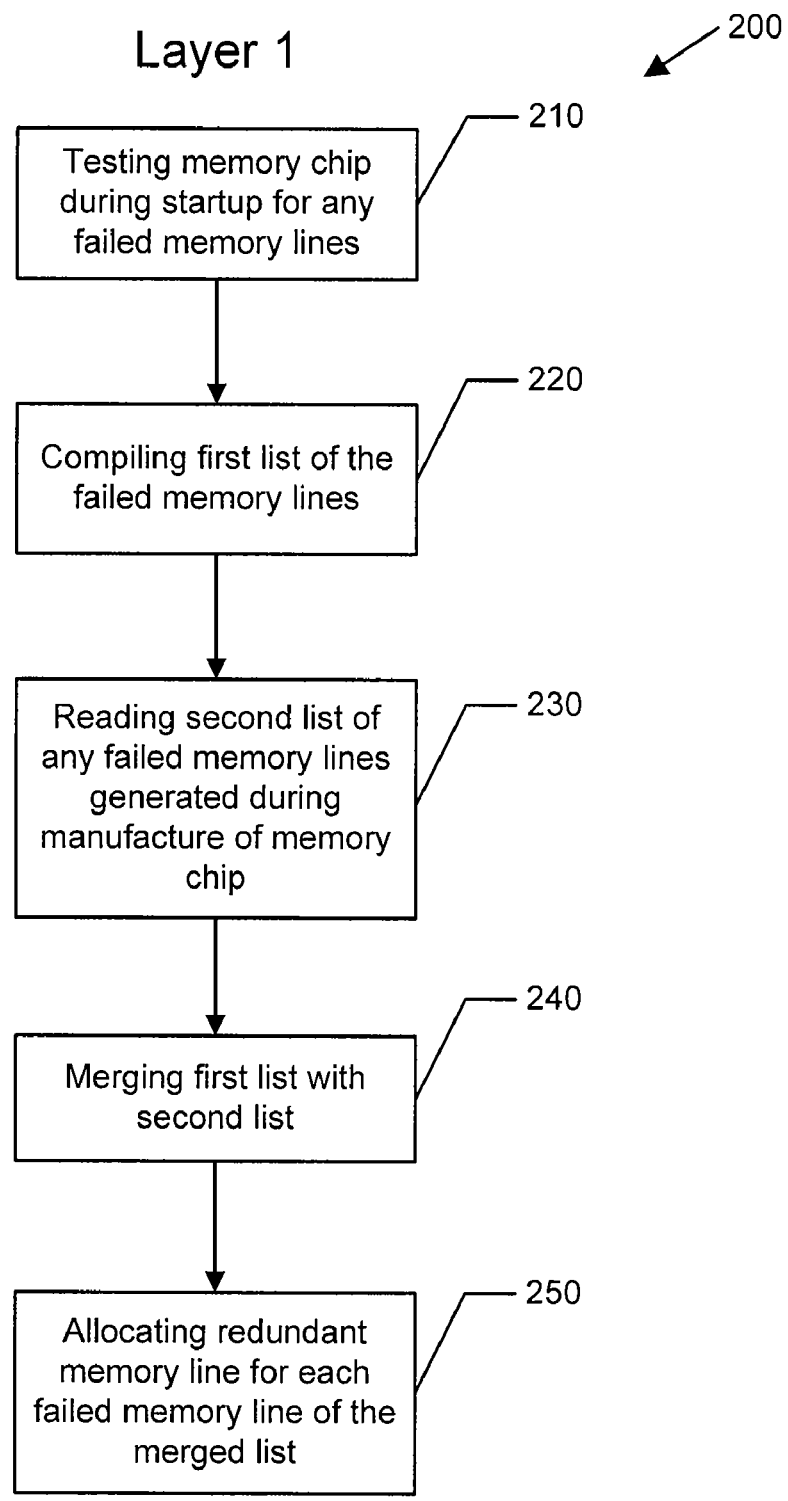
FIG. 2 is a flowchart illustrating layer 1 of a method according to an exemplary embodiment.

FIG. 2 is a flowchart illustrating the details of layer 1. Layer 1 is used to detect faulty memory lines when powering up the SRAM at boot time. By way of overview, in this layer the firmware is extended to run the MBIST+ diagnosis at boot time and update redundancy memory registers, and the information obtained while running the MBIST+ diagnosis is merged with manufacturing information.

More specifically, during startup the memory is tested for any failed memory lines (step 210). Lifetime errors, such as hard failures, are detected by the MBIST+ engine 120 running an MBIST+ test routine, which tests the memory lines in series. Various MBIST+ engines 120 running MBIST+ test routines for multiple memories can be run either in parallel or serially. Of course the specific design should take into consideration the maximum permissible boot time and the power consumed by running all memories in parallel with full activity. Most problems that are correctable will be detected using the MBIST+ routine.

The MBIST+ test routine is dependent on the deepest memory array and the frequency used at boot time. However, power consumption is also influenced by the frequency. A reasonable balance should preferably be found by setting the frequency as high as possible, while not causing power problems, and yet also trying to find reliability problems that are speed dependent and can be repaired. An additional goal is to minimize boot time. Luckily the normal digital logic is not busy during this boot time test, so that even this maximum activity in the SRAMs (running everything in parallel with 100% activity) should be acceptable even at maximum frequency for most applications.

Based on the MBIST+ test routine, a first list of failed memory lines is compiled (step 220). It is possible to run the MBIST+ and the flash ramp-up in parallel. Alternatively, if boot time is not a concern, the MBIST+ test routine could be run after the flash ramp-up.

Once both MBIST+ test routine and flash-ramp-up finish running, any detected failures stored by MBIST+ in the redundancy wrappers are compared with factory repair failure information stored in the flash memory. That is, a second list of any failed memory lines that was generated during manufacture of the memory is then read (step 230). The first list of failures detected by the MBIST+ test routine is added to or merged with this second list of manufacturing failures (step 240). Thus a third list comprising the first and second lists is created. As the factory repair information on failures is gathered by accumulating results from several tests at all process corners and using much more complex detection algorithms like March 14N, there is no guarantee that the boot time MBIST+ test routine will find all factory test problems.

Should any faulty lines in the SRAMs be found during this boot time test, then redundant memory lines in the corresponding redundancy wrappers will be allocated automatically for each of the failed memory lines of the merged list that were not already allocated at manufacture (step 250) and programmed such that they effectively replace the failed memory lines for any access to the SRAM afterwards. This is accomplished by copying the address from any of the failed memory lines to the respective allocated memory lines and setting the valid bit.

Normally this MBIST+ test routine is run at boot time after the boot software has set up the redundancy wrappers with the factory repair information stored in the flash memory. However, as the flash ramp up takes considerable time before the factory repair information can even be accessed, an additional or alternative boot time optimization approach may be used, such as merging the first list of failures detected by the MBIST+ test routine with the second list of manufacturing failures rather than running the MBIST+ test routine after installing the broken lines which were stored in the flash during the factory test.

B. Layer 2

Figure 3:
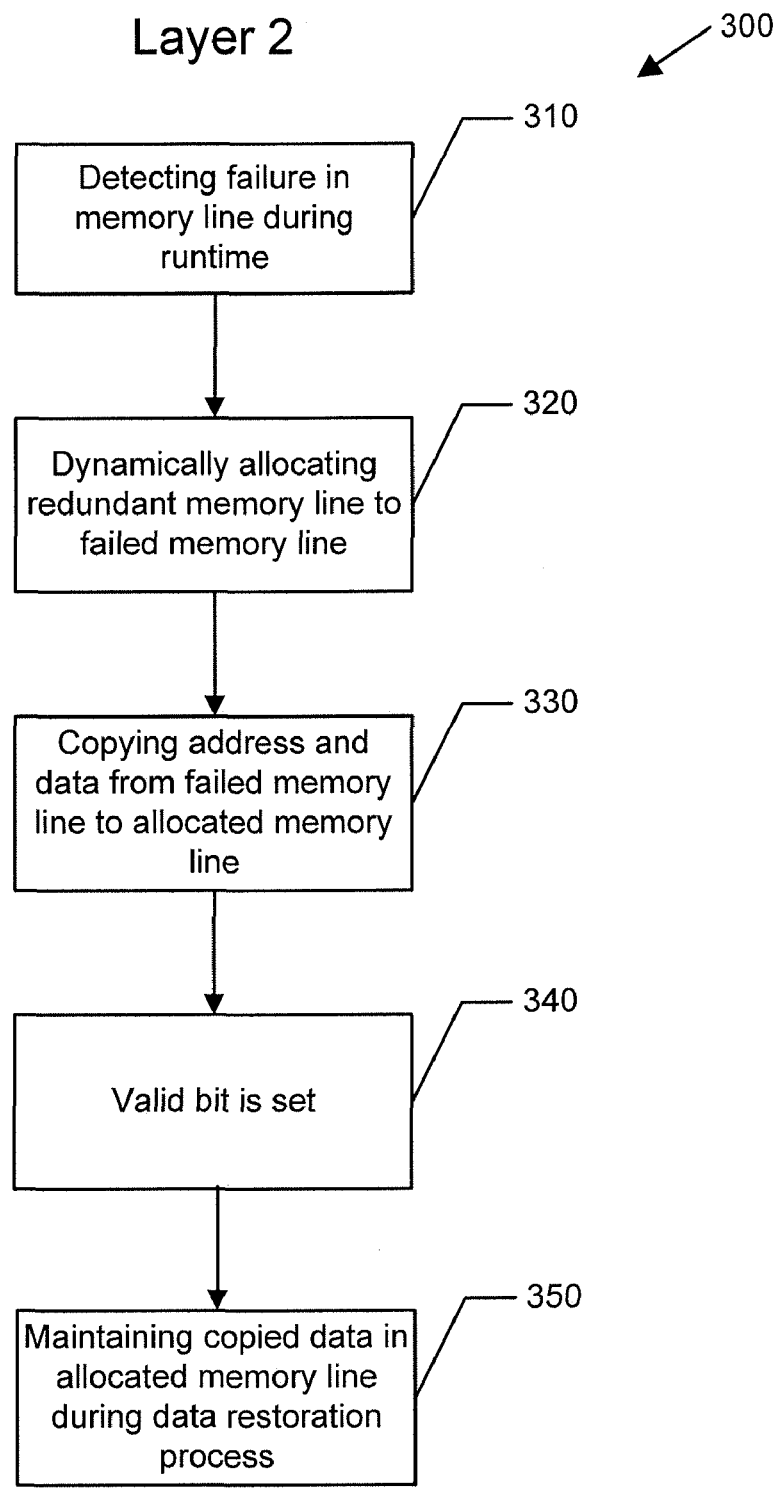
FIG. 3 is a flowchart illustrating layer 2 of a method according to an exemplary embodiment.

FIG. 3 is a flowchart illustrating the details of layer 2. Layer 2 is used to detect faulty memory lines and dynamically allocate redundant memory lines during runtime. By way of overview, layer 2 uses existent hardware, that is, redundant memory lines and parity error detection logic, for runtime update of redundant memory lines. Redundancy logic is extended to automatically copy the data and address of a faulty memory line to an available redundant memory line upon detection of a parity problem and to set the valid bit. Existent application software is used to react to parity failure, regardless of whether the failure is caused by a hard error or a soft error, so that the faulty data are eventually repaired by the software. For layer 2, maintaining the redundant line information to preserve the address and valid bit is important so that the reset does not destroy the information found during runtime; the data is repaired by software, so that the data is less relevant to be maintained during the reset.

More specifically, the second layer of SMART Repair concerns failures such as those that may appear only under a particular operating condition which is different from the boot time operating condition. This layer also considers that a new failure could occur after boot time, or even that a failure could be intermittent. To detect soft errors, this second layer uses a similar approach to that previously used to detect soft errors, that is, a parity check is used to detect a failure in a memory line during runtime (step 310). Parity detection logic 140 causes a non-maskable interrupt to the system software leading to a soft reset, which reinitializes software, restarts the system, and preserves the redundant memory line information.

In order to deal with a hard failure, as opposed to a soft failure that does not exist after the soft reset, the parity detection logic 140 needs to trigger an automatic and dynamic allocation of an additional redundant line in the redundancy wrapper 130 (similar to MBIST+ at boot time) and program the additional redundant memory line with the currently accessed address information and even copy the faulty data to this redundant memory line. This is, if a failed memory line is detected, a redundant memory line is allocated dynamically to the failed memory line (step 320). The address and data from the failed memory line is then copied to the allocated memory line (step 330), and the valid bit is set (step 340). The reaction to soft and hard failures is the same, and thus after a soft failure the same mechanism of replacing the memory line proactively is followed. Sometimes the result is that unnecessary redundant memory lines are assigned, but this is rare.

The rest of layer 2 is similar to previous handling of soft failures, that is a non-maskable interrupt is caused, the system recovers with a soft reset, and the contents in the memory lines are reinitialized and the system is restarted. In contrast to a power-up reset, there is no reset of the redundant line information in the redundancy wrapper 130 for a soft reset. The copied address, valid bit, and faulty data are maintained in the allocated memory line during a data restoration process, such as a soft reboot or reset (step 350), so that the newly allocated and programmed redundant memory line data is preserved and now masks the faulty memory line. Of course the faulty data should be restored by software, otherwise the data will remain faulty.

Since the parity detection logic 140 can not differentiate between a hard and a soft fail, there is also no differentiation in the behavior. However a soft fail would certainly not be found at the next MBIST+ boot time test, whereas the hard failure most likely would be found.

In order to detect a possible overflow of redundant memory lines, there is also one bit added to each MBIST+ to capture the case of parity error with an already full redundancy block—in this case the automatic copy feature is disabled and the overflow flag is set. As the parity fail also creates an interrupt, it is up to software to determine in which memory the overflow occurred and to react accordingly. First, in such a situation it is advisable to attempt a complete boot, as the parity fail could have been caused by a soft error, which would disappear with the MBIST+ check upon boot. However, if an overflow is detected again during boot and merging with the factory repair information, then the device is simply dead and can no longer be repaired.

C. Layer 3

Figure 4A:
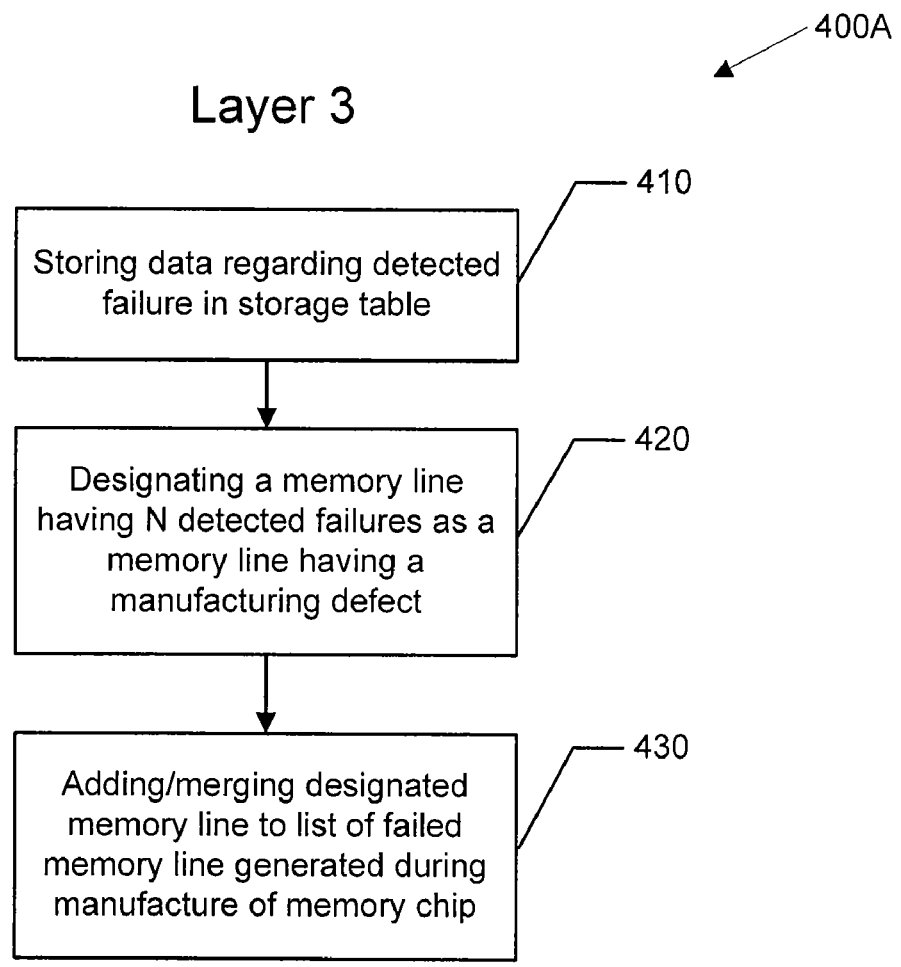
FIGS. 4A and 4B are flowcharts illustrating layer 3 of a method according to an exemplary embodiment.
Figure 4B:
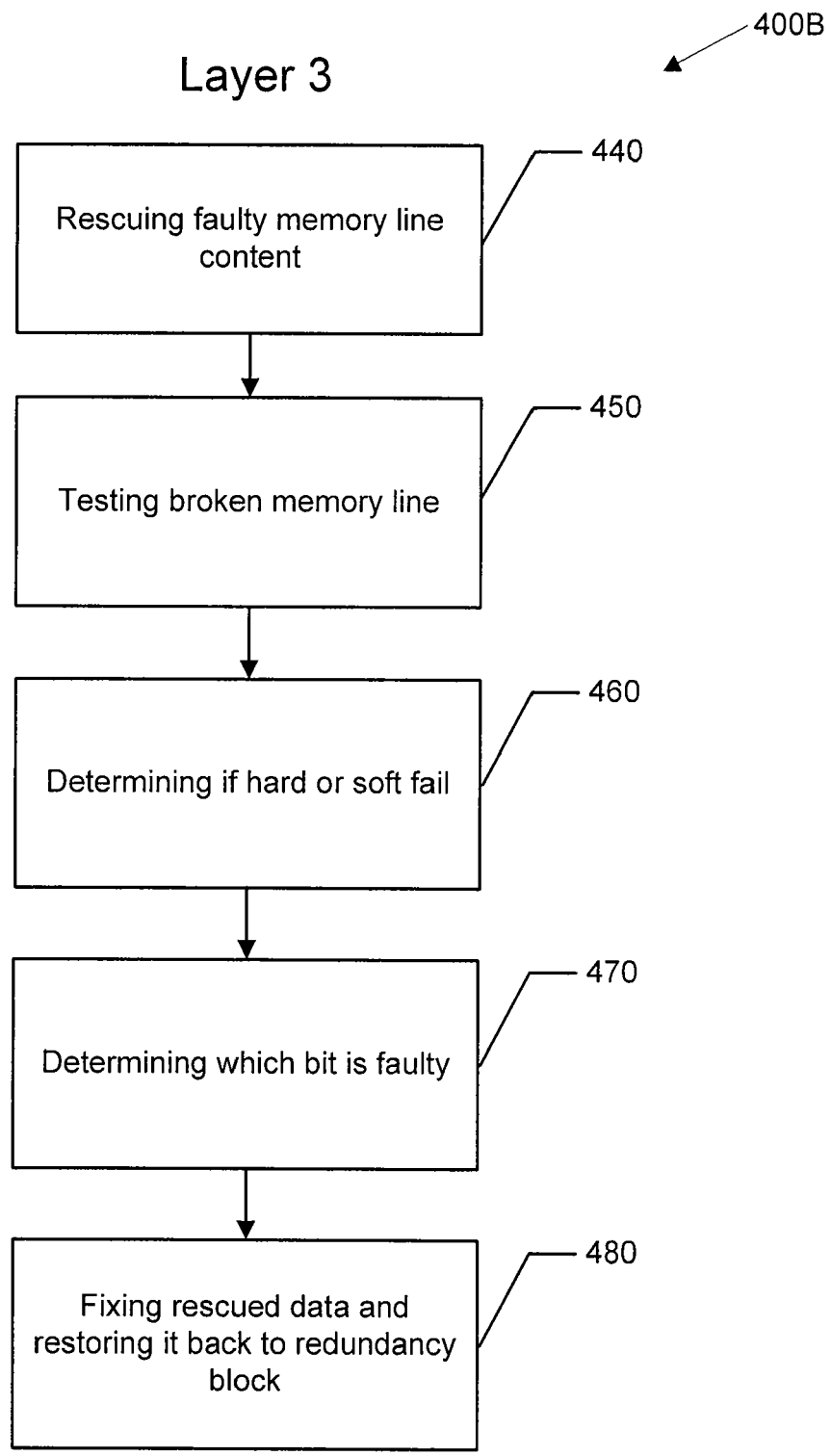

FIGS. 4A and 4B are flowcharts 400A, 400B illustrating the details of layer 3. Layer 3 is an optional layer that extends layers 1 and 2 using software to track and store failure records generated in layers 1 and 2 in non-volatile memory (e.g., flash memory). Firmware is extended to retrieve failure records from the non-volatile memory to update redundancy logic upon boot (in addition to factory repair information). Again, layer 3 is not required, but helps detect and resolve intermittent problems or operating condition dependent problems.

There is certainly some risk that a hard failure found at runtime with layer 2 of SMART Repair and causing a soft reset is never found by the next MBIST+ boot time test by layer 1 of SMART Repair due to the particular failure being dependent on certain operating conditions which appear only at runtime. Certainly the fail would be detected and repaired again by layer 2. In theory such a problem could happen repeatedly after a certain amount of time after boot while never being detected at boot. To protect against such repetitive behavior, a third software layer is introduced. Layer 3 of SMART Repair comprises software that accesses the hardware of layer 1 and layer 2 to prevent such repeating fails.

Layer 3 has a software library delivered to the customer which can be called with each runtime fail caused by layer 2 and tracks the fail with a fail record in the nonvolatile memory at a user definable address in a storage table (step 410). Additionally there is a boot software extension which accesses these tracking records to be able to basically extend the factory repair information with such reliability fails. There is one important difference, namely that a first runtime fail is not permitted to cause an extension of the factory repair information by this fail. Since soft fails can cause a runtime fail which can not be differentiated from hard reliability fails, the first occurrence should not lead to allocating a redundant memory line permanently at the next boot, otherwise soft fails would sooner or later use all of the additional redundant memory lines reserved for hard reliability fails. Therefore the software tracks the occurrence and the frequency of a fail. If the fail has happened at least twice at a same address, the memory line will typically be treated as having a manufacturing defect (step 420). The designated memory line is then merged with a list of failed memory lines stored in the non-volatile memory and generated during manufacture of the memory (step 430). Thus in effect the factory repair information is extended. A new hard reliability problem would therefore occur only twice, either being detected with layer 1 or 2 or a combination of both, before it is permanently repaired with each boot by the layer 3 extension.

It is important to note that layer 3 is not necessary for SMART Repair, and can be extended even further to allow the programmable MBIST+ to first rescue the faulty memory line content (step 440), test the broken memory line (step 450) to determine if the fail is a hard or soft fail (step 460), and to even determine the hard fail bit position (step 470), which is not known by pure parity detection. This bit position could even be used to flip the data bit in question and thus repair the data without even having to do a soft reset (step 480). This is one reason the faulty data word is copied from the faulty memory line to the newly allocated redundant memory line. Layer 3, being software, is fairly flexible and can be adapted to the demands of a particular system.

While layer 3 has been described as treating a particular memory line as having a manufacturing defect of it has two detected failure, the application is not limited in this respect. Any particular number of detected failures suitable for the intended purpose may be used.

Although the exemplary embodiments are described mainly with respect to SRAMs, they may be applicable to any kind of memory or device as suitable.

Although specific embodiments have been illustrated and described herein, it will be appreciated by those of ordinary skill in the art that a variety of alternate and/or equivalent implementations may be substituted for the specific embodiments shown and described without departing from the scope of the present application. This application is intended to cover any adaptations or variations of the specific embodiments discussed herein.

What is claimed is:

1. A method for allocating redundant memory lines in a memory chip, the method comprising:
    testing the memory chip during startup for any failed memory lines;
    compiling a first list of the failed memory lines;
    reading a second list of any failed memory lines generated during manufacture of the memory chip;
    merging the first list with the second list; and
    allocating a redundant memory line for each of the failed memory lines of the merged list.

2. The method of claim 1, wherein the testing comprises running an MBIST+ test routine during startup.

3. The method of claim 1, further comprising:
    detecting a failure in a memory line during runtime; and
    adding the detected failed memory line to the second list.

4. The method of claim 3, wherein the detected failed memory line is added to the second list when the failure in the memory line occurs during runtime N times.

5. The method of claim 4, wherein N is 2.

6. The method of claim 3, wherein the detecting comprises at least one of a parity check and error correction code encoding.

7. The method of claim 1, furthering comprising copying the address and data from any of the failed memory lines to the respective allocated memory lines.

8. The method of claim 7, wherein the copied address and data in the allocated memory line is maintained during a data restoration process.

* * * * *